US006529432B2

United States Patent
Kim et al.

(10) Patent No.: US 6,529,432 B2
(45) Date of Patent: Mar. 4, 2003

(54) SEMICONDUCTOR MEMORY DEVICE AND DATA READ METHOD THEREOF

(75) Inventors: Byung-Chul Kim, Suwon (KR); Won-Il Bae, Youngin (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 10/144,517

(22) Filed: May 13, 2002

(65) Prior Publication Data

US 2002/0196689 A1 Dec. 26, 2002

(30) Foreign Application Priority Data

Jun. 25, 2001 (KR) .................................. 2001-0036374

(51) Int. Cl.[7] ............................................... G11C 7/00
(52) U.S. Cl. .................... 365/207; 365/189.05; 365/208
(58) Field of Search ................................. 365/207, 208, 365/189.05, 233, 191, 194

(56) References Cited

U.S. PATENT DOCUMENTS 5,555,526 A * 9/1996 Kim ........................... 365/203
6,094,380 A * 7/2000 Kim ........................... 365/194
6,333,895 B1 * 12/2001 Hamamoto et al. ......... 365/233

* cited by examiner

Primary Examiner—Son T. Dinh
(74) Attorney, Agent, or Firm—Mills & Onello LLP

(57) ABSTRACT

A semiconductor memory device includes a memory cell array and a differential amplifying and latching circuit for latching and outputting each of signal pairs output from the memory cell array in case of a first latency operation, and for amplifying a voltage difference of each of the signal pairs output from the memory cell array in case of a second latency operation.

20 Claims, 14 Drawing Sheets

SEMICONDUCTOR MEMORY DEVICE AND DATA READ METHOD THEREOF

BACKGROUND OF THE INVENTION

1. Field of the Invention

The present invention relates to a semiconductor memory device, and more particularly, to a semiconductor memory device and data read method thereof which can stably output a data read from a memory cell array.

2. Description of Related Art

A conventional semiconductor memory device transmits data read from a memory cell array to common data I/O lines, and outputs the data transmitted to the common data I/O lines via a current-voltage converter, a differential amplifier (or latch), a data output buffer, and a data output driver.

In greater detail, the differential amplifier is arranged at an output stage of the current-voltage converter to amplify output data of the current-voltage converter and to transmit it to the data output buffer. Alternatively, a latch latches output data of the current-voltage converter and transmits it to the data output buffer.

FIG. 1 is a block diagram illustrating a conventional semiconductor memory device. The semiconductor memory device of FIG. 1 includes a memory cell array 10, current-voltage converters 20-1 to 20-n, differential amplifiers 22-1 to 22-n, data output buffers 24-1 to 24-n, and data output drivers 26-1 to 26-n.

In particular, in FIG. 1, IVC denotes the current-voltage converters, DA denotes the differential amplifiers, DOB denotes the data output buffers, and DOD denotes the data output drivers. LIO11/B to LIO1n/B, . . . , LIOm1/B to LIOmn/B denote local data I/O line pairs, and MIO1/B to MIOn/B denote main data I/O line pairs.

Functions of the components of FIG. 1 are described focusing on a read operation. Data stored in the memory cell array 10 is transferred to the local data I/O line pairs LIO11/B to LIO1n/B, . . . , LIOm1/B to LIOmn/B and to the main data I/O data line pairs MIO1/B to MIOn/B, in sequence. The current-voltage converters 20-1 to 20-n convert a current difference of the data pairs transferred to the main data I/O line pairs MIO1/B to MIOn/B, respectively, into a voltage difference to generate data X. The data output buffers 24-1 to 24-n buffer the data Z output from the differential amplifiers 22-1 to 22-n, respectively. The data output drivers 26-1 to 26-n drive the data output from the data output buffers 24-1 to 24-n to output data D1 to Dn, respectively.

FIGS. 2A to 2C are timing diagrams illustrating operation of the current-voltage converter and the differential amplifier. FIG. 2A shows the timing diagram during normal operation, FIG. 2B shows the timing diagram during a high-frequency operation, and FIG. 2C shows the timing diagram according to a process variation.

In FIGS. 2A to 2C, CLK denotes a clock signal, CMD denotes a command signal, and a hatched portion denotes an invalid data period.

Referring to FIG. 2A, data CSA1 to CSA4 are output from the current-voltage converters 20-1 to 20-n in sequence. When a signal Y is input so as to enable the differential amplifiers 22-1 to 22-n, the differential amplifiers 22-1 to 22-n sequentially receive the data CSAL to CSA4 and sequentially generate the data DO1 to DO4 in response to the signal Y. Period "t1" represents a time period from a time point that the clock signal CLK is generated when the read command is applied to a time point that the first data CSAL begins to be output through the current-voltage converters 20-1 to 20-n. Period "t2" represents a time period from a time point that the clock signal CLK is generated when the read command is applied to a time point that the signal Y is generated. A time period "t3" represents an enable period of the signal Y.

Referring to FIG. 2B, a cycle that the clock signal CLK is generated becomes faster, and the data CSA1 to CSA4 are sequentially output from the current-voltage converters 20-1 to 20-n in response to the clock signal CLK. The differential amplifiers 22-1 to 22-n receive the data CSA1 to CSA4 and generate data DO1 to DO4 in response to the signal Y. At this point, when the data CSA2 is input to the differential amplifiers 22-1 to 22-n during the enable period t3 of the signal Y, the differential amplifiers 22-1 to 22-n output not the data DO1 but the next data DO2. This is because when the data is transited during the enable period t3 of the differential amplifiers 22-1 to 22-n, the output data of the differential amplifiers 22-1 to 22-n is changed. Accordingly, since the data DO1 cannot be output in case of FIG. 2B, a data read error occurs. That is, in FIG. 2B, the data DO2 to DO4 are cut partially, but the data DO2 to DO4 are connected to be output by the data output buffers.

Referring to FIG. 2C, due to a process variation, the data CSA1 to CSA4 output from the current-voltage converters 20-1 to 20-n are delayed by a time period t4. Even though the data CSA1 to CSA4 are delayed by the time period t4, when the data CSA1 to CSA4 are input within the enable period t3 of the signal Y, the differential amplifiers 22-1 to 22-n can output the data DO1 to DO4 stably. In FIG. 2C, the data DO1 to DO4 are cut partially, but the data DO1 to DO4 are connected to be output by the data output buffers. Therefore, the data read error does not occur.

When a data read path of the semiconductor memory device is configured by the current-voltage converter and the differential amplifier, a data read error occurs during the high-frequency operation but the data read error resulting from the process variation does not occur.

FIG. 3 is a block diagram illustrating a configuration of a data read path of another conventional semiconductor memory device. The semiconductor memory device of FIG. 3 includes a memory cell array 10, current-voltage converters 20-1 to 20-n, latches 28-1 to 28-n, data output buffers 24-1 to 24-n, and data output drivers 26-1 to 26-n.

In FIG. 3, LA denotes the latch. Like references of FIGS. 1 and 3 denote like parts. The latch LA latches and outputs output data of the current-voltage converters 20-1 to 20-n in response to the signal Y. The remaining components of FIG. 3 except the latch LA can be understood with reference to the description of FIG. 1, and thus their description is omitted to avoid a redundancy.

FIGS. 4A to 4C are timing diagrams illustrating operation of the current-voltage converter and the latch. FIG. 4A shows the timing diagram during normal operation, FIG. 4B shows the timing diagram during a high-frequency operation, and FIG. 4C shows the timing diagram according to a process variation.

In FIGS. 4A to 4C, CLK denotes a clock signal, CMD denotes a command signal, and a hatched portion denotes an invalid data period.

Referring to FIG. 4A, data CSA1 to CSA4 are output from the current-voltage converters 20-1 to 20-n in sequence. The latches 28-1 to 28-n sequentially receive the data CSA1 to CSA4 and sequentially generate the data DO1 to DO4 in response to the signal Y. Period "t1" represents a time period from a time point that the clock signal CLK is generated when the read command is applied to a time point that the first data CSA1 begins to be output through the current-voltage converters 20-1 to 20-n. Period "t2" represents a time period from a time point that the clock signal CLK is generated when the read command is applied to a time point that the signal Y is generated. Period "t3" represents an enable period of the signal Y.

Referring to FIG. 4B, a generation cycle of the clock signal CLK becomes faster, and the data CSA1 to CSA4 are sequentially output from the current-voltage converters 20-1 to 20-n in response to the clock signal CLK. The latches 28-1 to 28-n receive and latch the data CSA1 to CSA4 and generate the data DO1 to DO4 at a rising edge of the signal Y.

The latches 28-1 to 28-n maintain the signals latched at a rising edge of the signal Y "as is" even though a state of the data output from the current-voltage converters 20-1 to 20-n is varied during the enable period t3 of the signal Y. Accordingly, the data read error does not occur.

Referring to FIG. 4C, due to a process variation, the data CSA1 to CSA4 output from the current-voltage converters 20-1 to 20-n are delayed by a time period t4. The latches 28-1 to 28-n latch the invalid data at a rising edge of the signal Y and thus cannot output the data DO1. The latches 28-1 to 28-n latch the data CSAL to CSA4 and output the data DO2 to DO4 in response to the signal Y. In this case, the data DO1 cannot be output, leading to a data read error.

As described above, when the latches 28-1 to 28-n are arranged at output stages of the current-voltage converters 20-1 to 20-n, the data can be output stably during the high-frequency operation, but when the process variation occurs, the invalid data is output.

When the conventional semiconductor memory device is configured to include the current-voltage converter and the differential amplifier in the data read path, the data read error occurs during high-frequency operation, whereas the data can be output stably when the process is varied. On the other hand, when the conventional semiconductor memory device is configured to include the current-voltage converter and the latch in the data read path, the data can be output stably during high-frequency operation, whereas the data read error occurs when the process is varied.

CAS latency is defined as the period of time in clock cycles between when a read command is applied to a semiconductor memory device and when valid data are applied at the outputs of the device, wherein the number of clock cycles is an integer. For example, a CAS latency of 2 means that valid data are output from the device two clock cycles after the read command is applied.

When the CAS latency is 2, the semiconductor memory device requires a frequency characteristic lower than when the CAS latency is 3. When the CAS latency is 3, the semiconductor memory device requires a time tAA, i.e., the data read speed not higher and a frequency characteristic higher than when the CAS latency is 2.

Accordingly, the data read error can be reduced by outputting the output data of the current-voltage converter through the latch in case of the CAS latency operation that is relatively high in need for a frequency characteristic during a read operation, and by outputting the output data of the current-voltage converter through the differential amplifier in case of the CAS latency operation that is relatively low in need for a frequency characteristic during a read operation.

SUMMARY OF THE INVENTION

It is an object of the present invention to provide a semiconductor memory device which can output data stably by differentiating data read paths in a read operation that have a high need for frequency performance characteristics from those in a read operation that is relatively low in need for a frequency performance characteristic during the read operation.

It is another object of the present invention to provide a data read method which can output data in a stable fashion.

The present invention is directed to a semiconductor memory device. The device includes a memory cell array and a differential amplifying and latching circuit for latching and outputting each of signal pairs output from the memory cell array in case of a first latency operation, and for amplifying a voltage difference of each of the signal pairs output from the memory cell array in case of a second latency operation.

The present invention further provides a semiconductor memory device which includes a memory cell array, a latch means for latching and outputting each of signal pairs output from the memory cell array in case of a first latency operation and a differential amplifying circuit for amplifying and outputting each of the signal pairs output from the memory cell array in case of a second latency operation.

The present invention further provides a semiconductor memory device that includes a memory cell array, a first amplifying circuit for amplifying and outputting signals output from the memory cell array in case of a first latency operation, and a second amplifying circuit for amplifying and outputting the signals output from the memory cell array in case of a second latency operation.

The present invention further provides a method of reading data in a semiconductor memory device. In accordance with the method, data is read from a memory cell array. In the case of a first latency operation, data output from the memory cell array is latched and output. In the case of a second latency operation, the data output from the memory cell array is amplified and output.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 5:
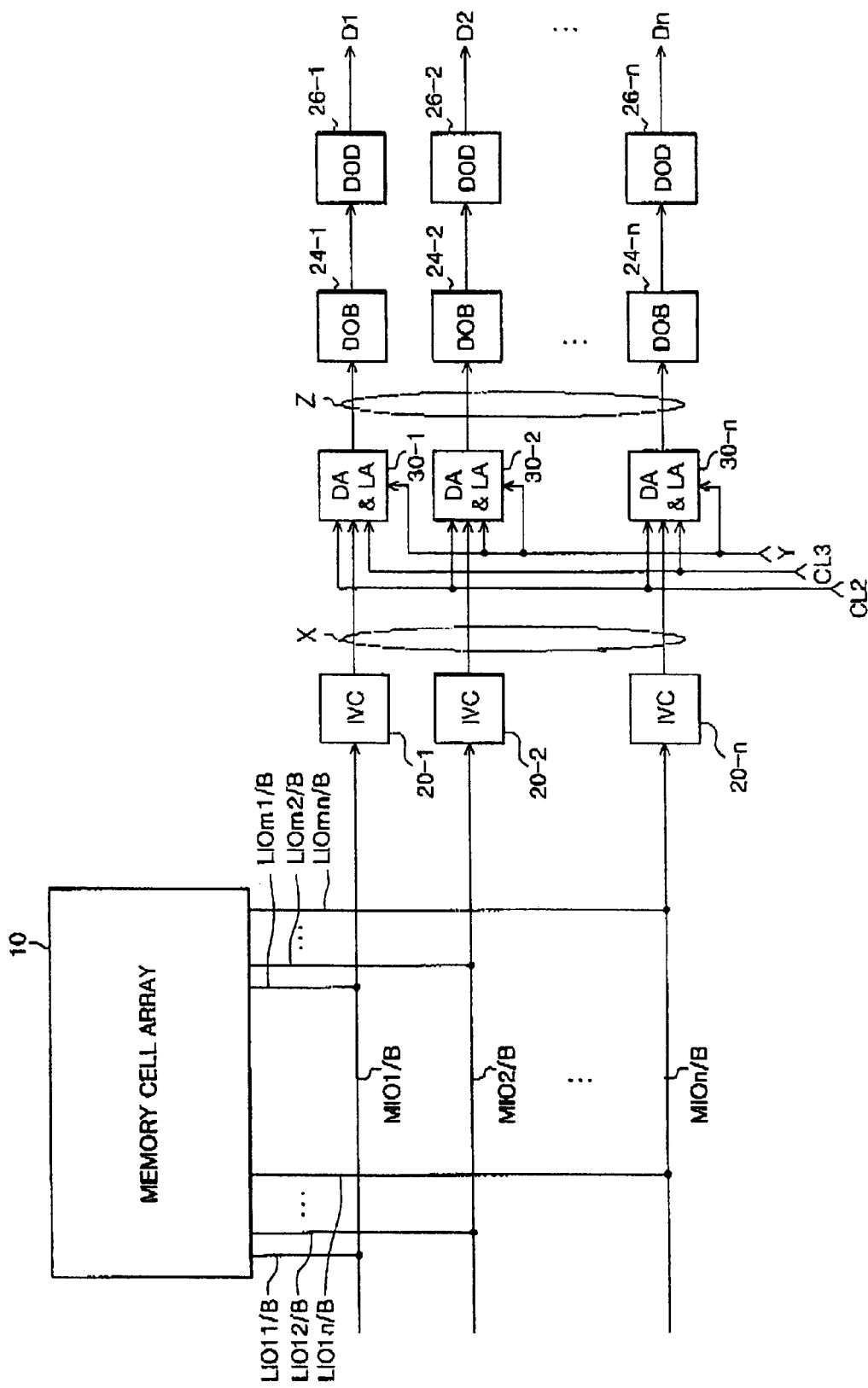
FIG. 5 is a block diagram illustrating a semiconductor memory device according to a first preferred embodiment of the present invention.

FIG. 5 is a block diagram illustrating a semiconductor memory device according to a first preferred embodiment of the present invention. The semiconductor memory device of FIG. 5 includes a differential amplifier and latches 30-1 to 30-n in contrast to the differential amplifiers 22-1 to 22-n in the prior art device of FIG. 1. Like reference numerals of FIGS. 1 and 5 denote like parts.

The differential amplifier and latches 30-1 to 30-n output data output from the current-voltage converters 20-1 to 20-n through the differential amplifiers in response to the signal Y when the CAS latency is 2, and output data output from the current-voltage converters 20-1 to 20-n through the latches in response to the signal Y when the CAS latency is 3. That is, the differential amplifier and latches 30-1 to 30-n operate as the differential amplifier in response to the signals CL2 and Y, and operate as the latch in response to the signals CL3 and Y. It should be noted that the semiconductor memory device of FIG. 5 includes the current-voltage converters 20-1 to 20-n, but does not always require the current-voltage converters 20-1 to 20-n.

Figure 1:
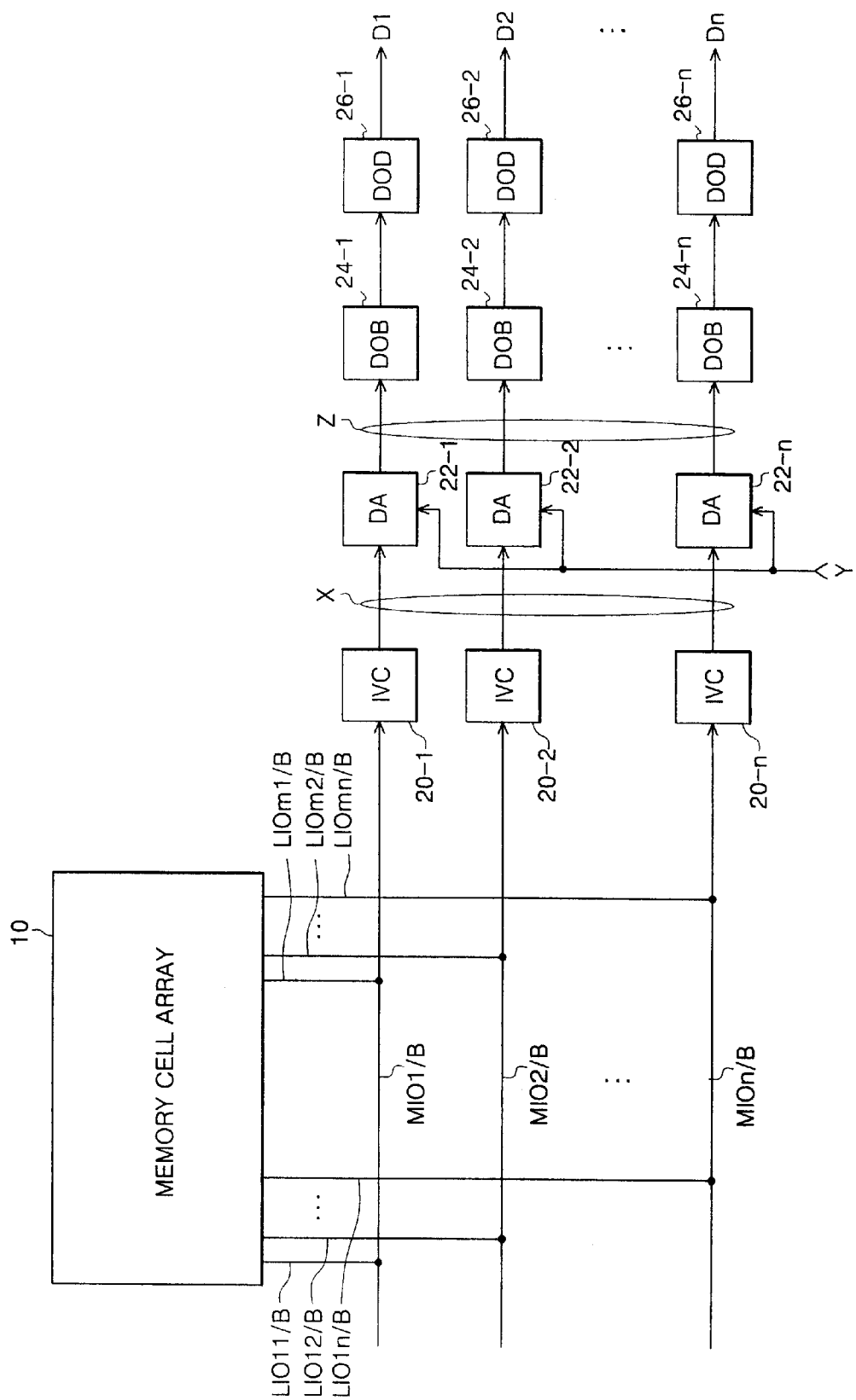
FIG. 1 is a block diagram illustrating a conventional semiconductor memory device.
Figure 2A:
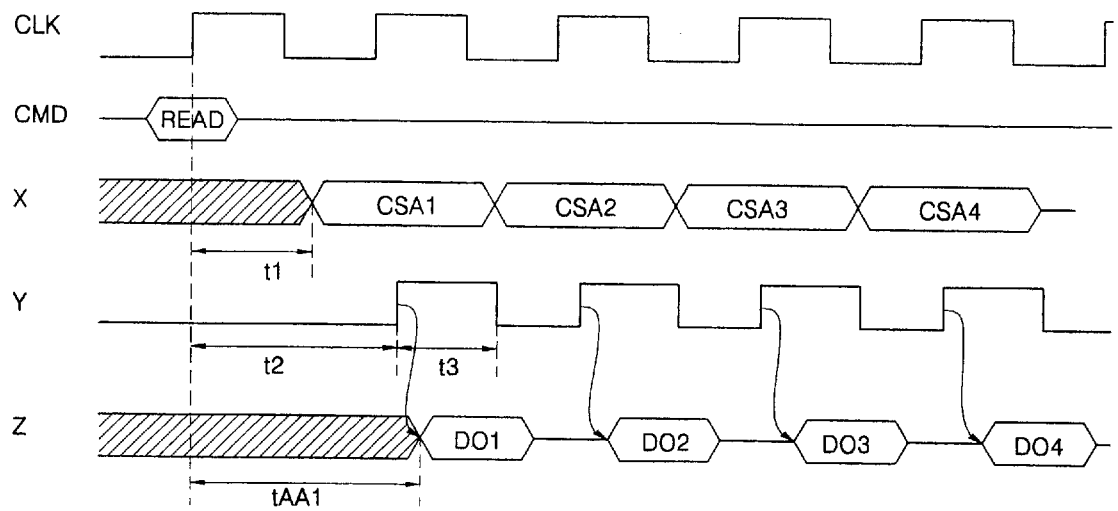
FIGS. 2A to 2C are timing diagrams illustrating operation of a current-voltage converter and a differential amplifier of FIG. 1.
Figure 2B:
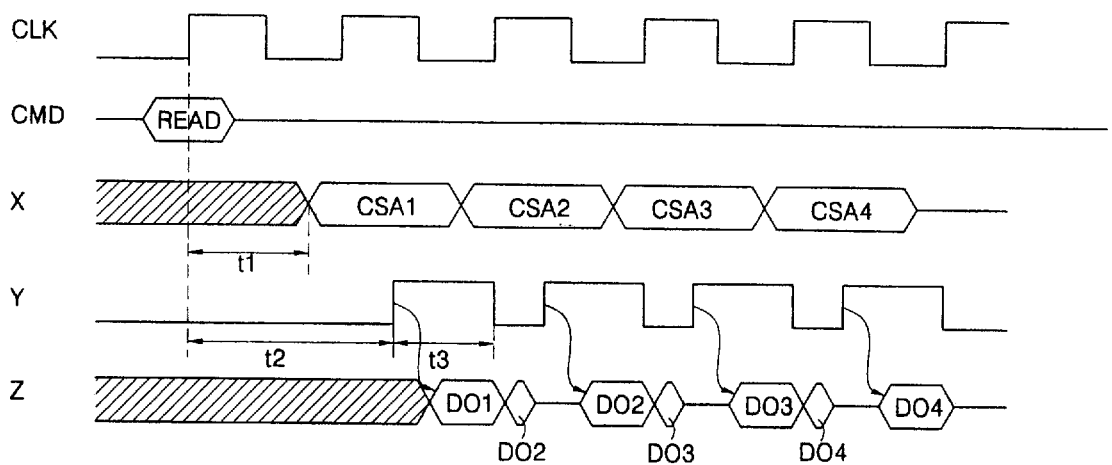
Figure 2C:
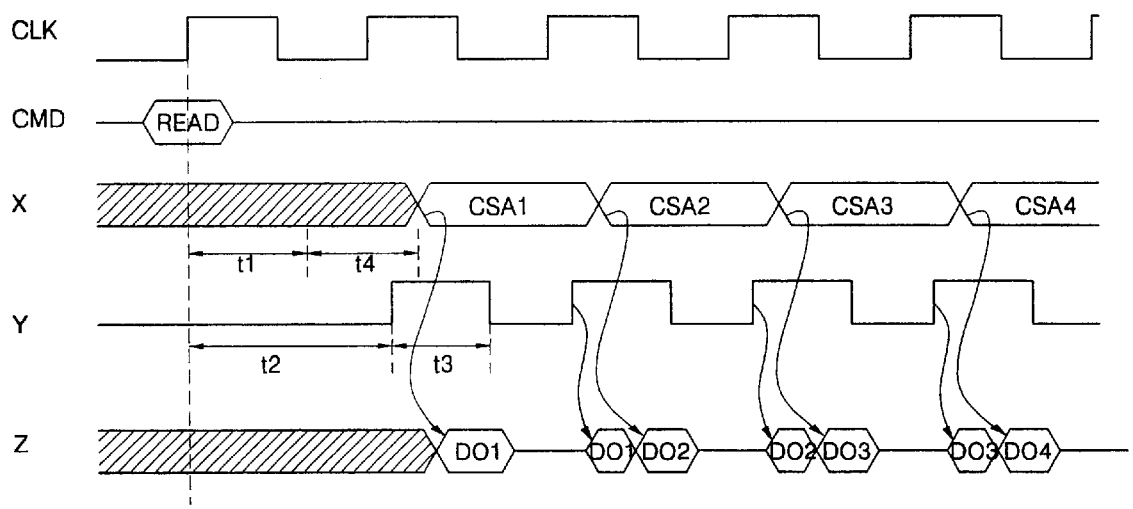
Figure 3:
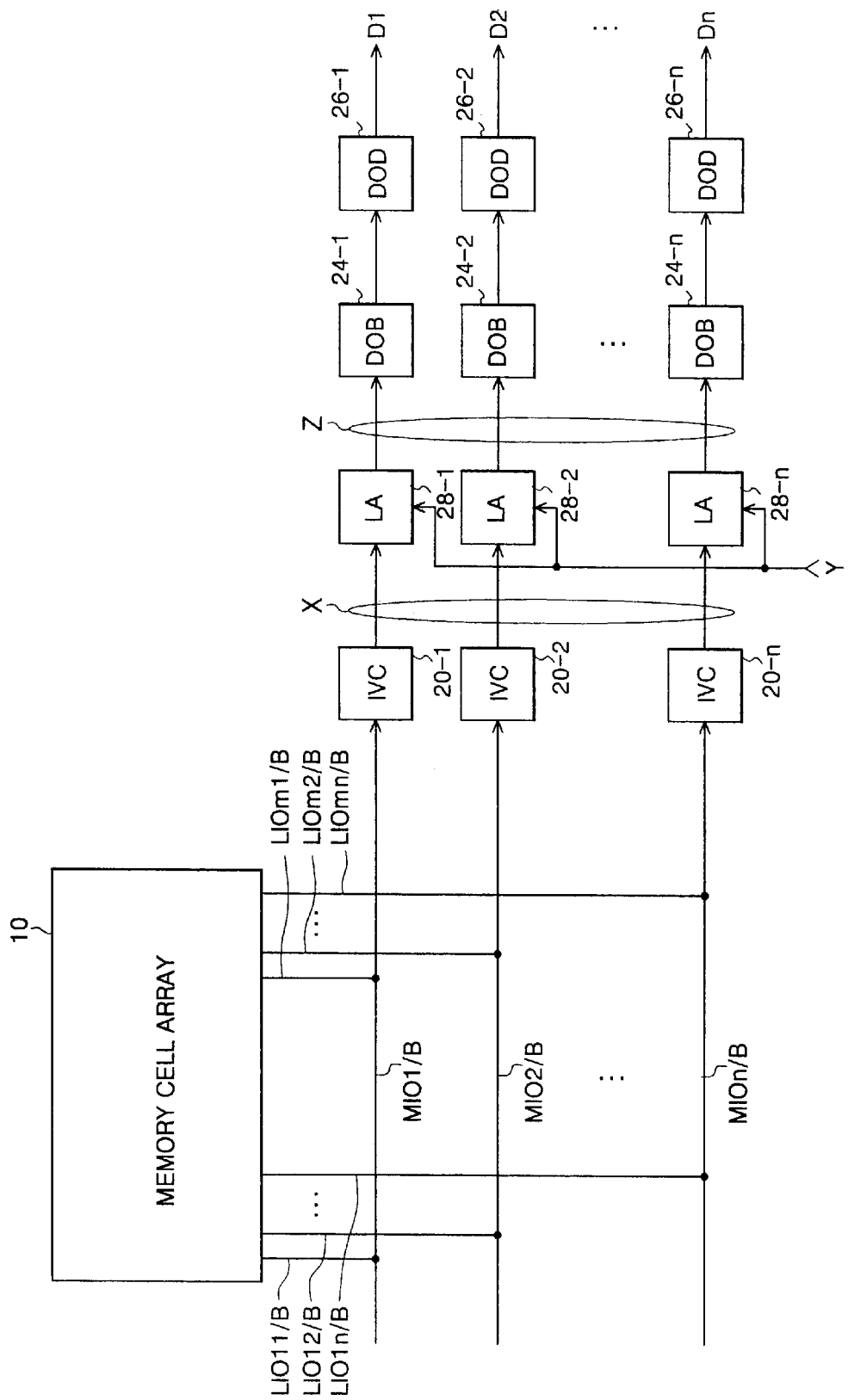
FIG. 3 is a block diagram illustrating another conventional semiconductor memory device.
Figure 4A:
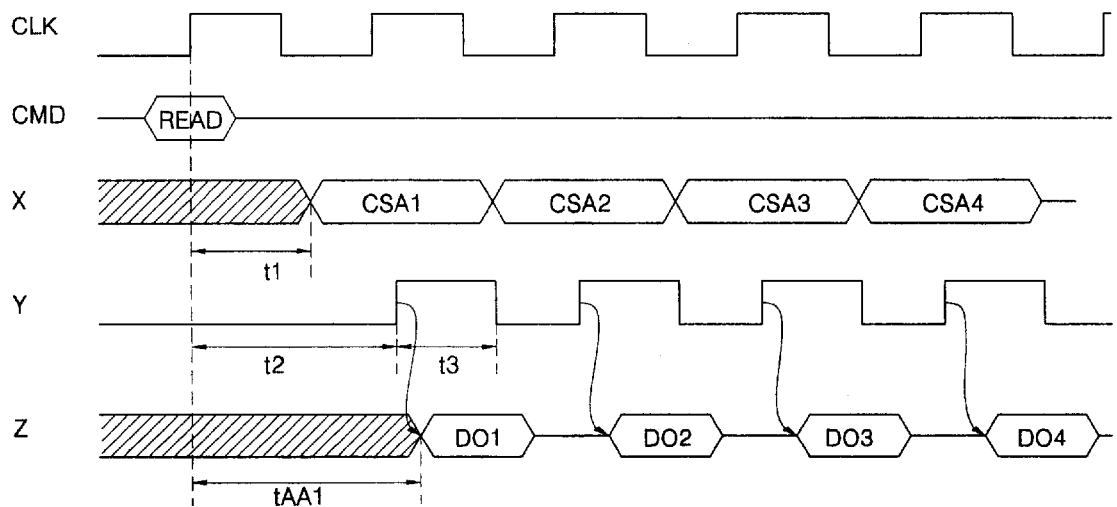
FIGS. 4A to 4C are timing diagrams illustrating operation of a current-voltage converter and a latch of FIG. 3.
Figure 4B:
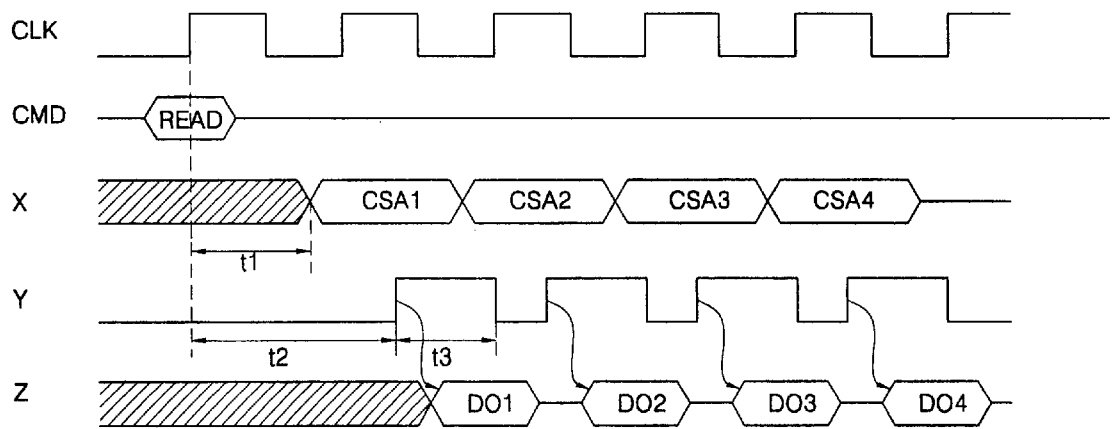
Figure 4C:
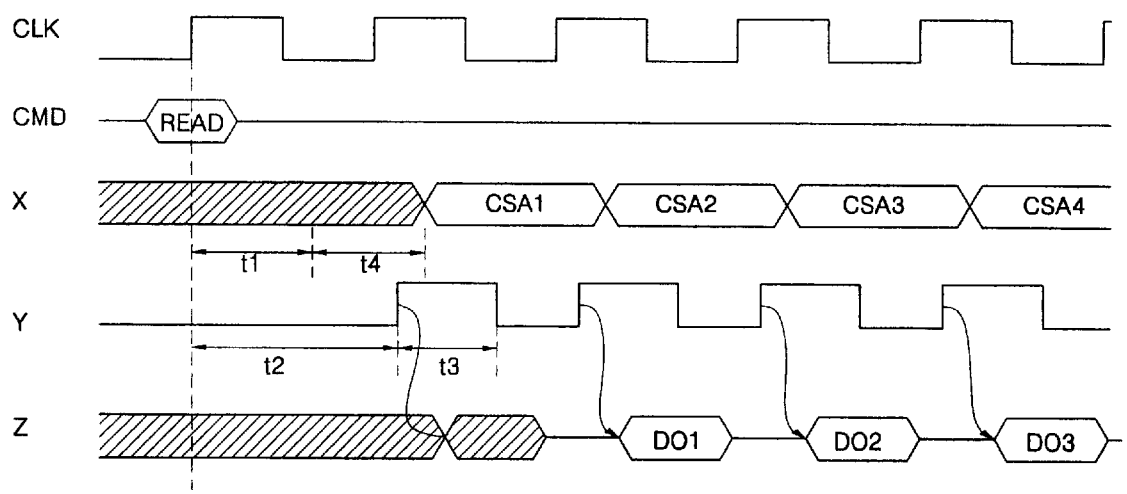

The remaining components except the differential amplifier and latches 301 to 30-n can be understood with reference to a description of FIG. 1, and their description is omitted to avoid redundancy.

Figure 6:
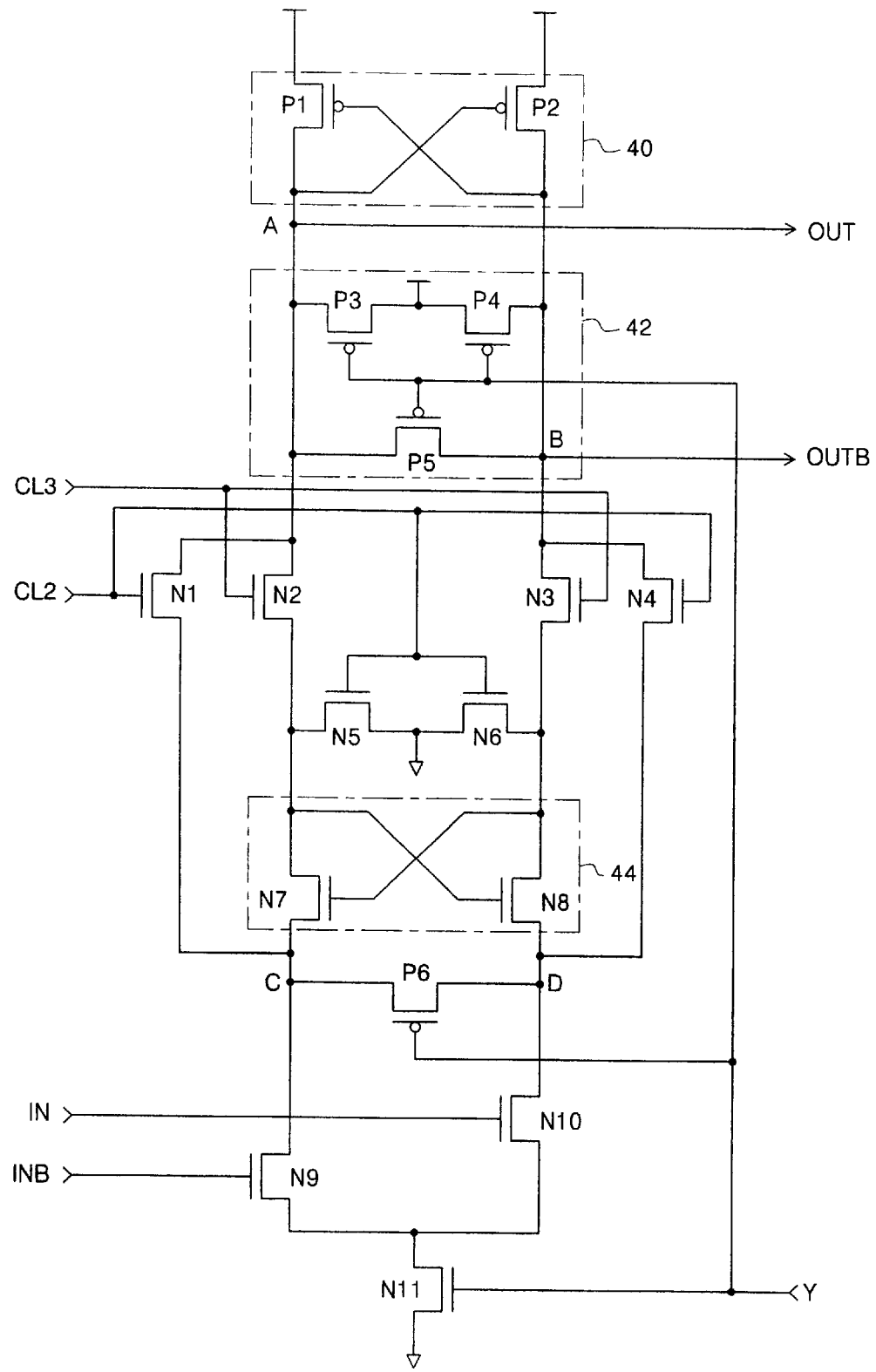
FIG. 6 is a circuit diagram illustrating a differential amplifier and latch of FIG. 5.

FIG. 6 is a circuit diagram illustrating one embodiment of the differential amplifier and latch of FIG. 5. The differential amplifier and latch of FIG. 6 includes a PMOS latch 40 having PMOS transistors P1 and P2, a pre-charge circuit 42 having PMOS transistors P3 to P5, a NMOS latch 44 having NMOS transistors N7 and N8, NMOS transistors N1 to N6 and N9 to N11, and a PMOS transistor P6.

When the CAS latency is set to 2, the signal CL2 has a logic "high" level. As a result, the NMOS transistors N1, N4, N5, and N6 are turned on, whereupon the NMOS transistors N7 and N8 are turned off. Also, the signal CL3 has a logic "low" level. So, the NMOS transistors N2 and N3 are turned off. Accordingly, in this case, the differential amplifier and latch is configured by the PMOS latch 40. When the signal Y has a logic "low" level, the PMOS transistors P3 to P5 are turned on so that nodes A and B are pre-charged, and the PMOS transistor P6 is turned on so that nodes C and D are pre-charged. In this state, when the signal Y is transitioned to a logic "high" level, the NMOS transistor N11 is turned on, the PMOS transistor P6 is turned off, and the pre-charge circuit 42 is disabled, whereupon operation of the differential amplifier and latch is enabled. At this time, when an input signal IN having a logic "high" level and an inverted input signal INB having a logic "low" level are applied from the current-voltage converter, the node D goes to a logic "low" level, and the node C goes to a logic "high" level. As a result, the node A is transitioned from a pre-charge level to a logic "high" level, and the node B is transitioned from a pre-charge level to a logic "low" level. Accordingly, output data OUT having a logic "high" level is generated, and inverted output data OUTB having a logic "low" level is generated. Signals of the nodes A and B are amplified by the PMOS latch 40. However, when the input data IN and the inverted input data INB are transitioned to a logic "low" level and a logic "high" level during an enable period of the signal Y, respectively, the output data OUT and the inverted output data OUTB are transitioned to a logic "low" level and a logic "high" level, respectively. That is, the differential amplifier and latch DA & LA operates as a differential amplifier.

When the CAS latency is set to 3, the signal CL3 has a logic "high" level. As a result, the NMOS transistors N2 and N3 are turned on. At this time, the signal CL2 has a logic "low" level, and so the NMOS transistors N1, N4, N5, and N6 are turned off. Accordingly, in this case, the differential amplifier and latch is configured by the PMOS latch 40 and the NMOS latch 44. When the signal Y is transitioned to a logic "high" level, the NMOS transistor N11 is turned on, the PMOS transistor P6 is turned off, and operation of the pre-charge circuit 42 is disabled, whereupon operation of the differential amplifier and latch DA & LA is enabled. At this time, when the input data IN having a logic "high" level and the inverted input data INB having a logic "low" level are applied from the current-voltage converter, the node D goes to a logic "low" level, and the node C goes to a logic "high" level. As a result, the node A is transitioned to a logic "high" level, and the node B is transitioned to a logic "low" level. Accordingly, the output data OUT is transitioned to a logic "high" level, and the inverted output data OUTB is transitioned to a logic "low" level. Signals of the nodes A and B are latched by the PMOS latch 40 and the NMOS latch 44. Thereafter, even though the input data IN and the inverted input data INB are transitioned to a logic "low" level and a logic "high" level within the enable period of the signal Y, respectively, so that signal levels of the nodes C and D are transitioned, since a current path cannot be formed between the node A and the node C, and the node B and the node D by the NMOS latch 44, the output data OUT and the inverted output data OUTB are maintained to a latched level. That is, the differential amplifier and latches DA & LA operates as the latch.

Figure 7A:
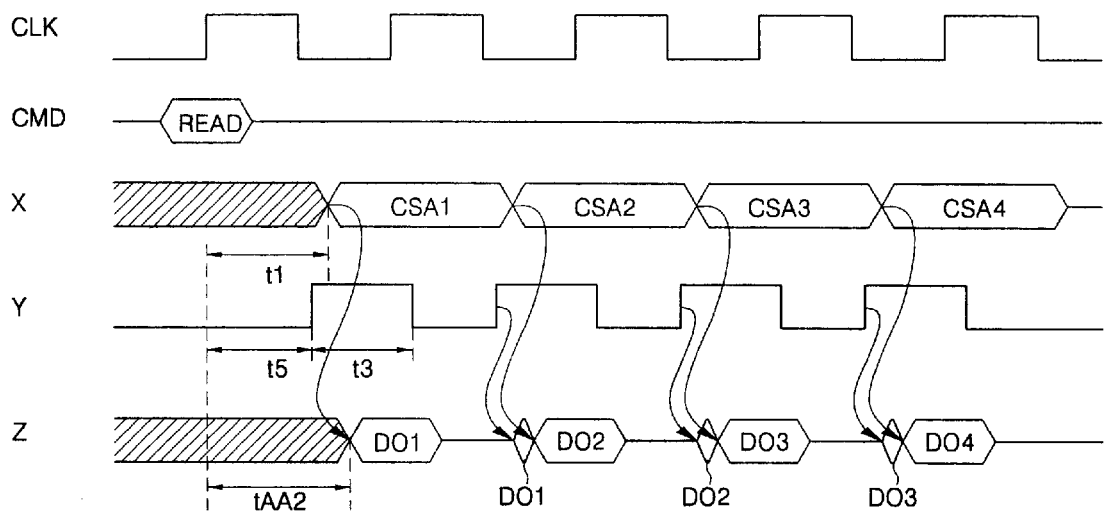
FIG. 7A is a timing diagram illustrating operation of a current-voltage converter and the differential amplifier and latch of FIG. 5, wherein a CAS latency is 2, and the differential amplifier and latch operates as the differential amplifier.
Figure 7B:
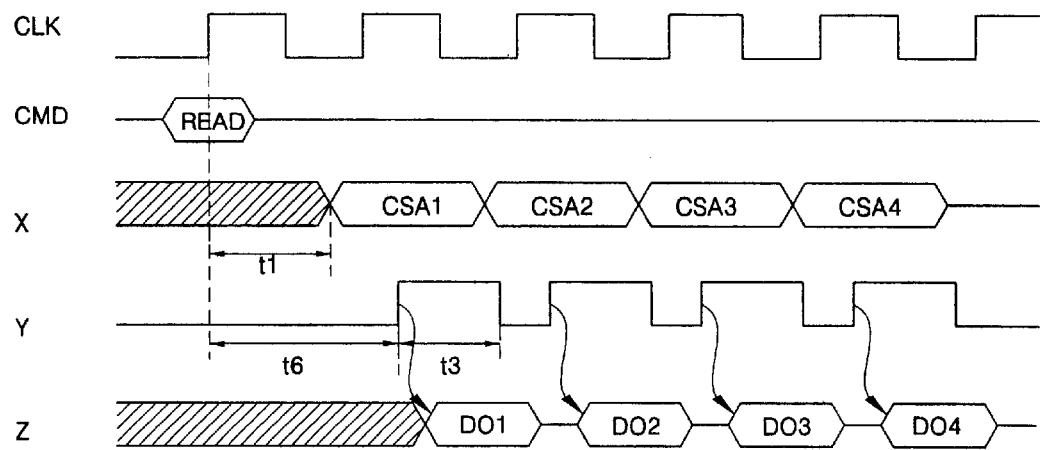
FIG. 7B is a timing diagram illustrating operation of the current-voltage converter and the differential amplifier and latch of FIG. 5, wherein the CAS latency is 3, and the differential amplifier and latch operates as the latch.

FIG. 7A is a timing diagram illustrating operation of the current-voltage converter and the differential amplifier and latch of FIG. 5, wherein the CAS latency is 2, and the differential amplifier and latch operates as the differential amplifier. FIG. 7B is a timing diagram illustrating operation of the current-voltage converter and the differential amplifier and latch of FIG. 5, wherein the CAS latency is 3, and the differential amplifier and latch operates as the latch.

In FIGS. 7A and 7B, CLK denotes a clock signal, CMD denotes a command signal, and a hatched portion denotes an invalid data period.

Referring to FIG. 7A, since the differential amplifier and latch operates as the differential amplifier, even though a time period t5 of from a rising edge of the clock signal CLK to an enable time point of the signal Y is reduced when the read command is applied, the data can be output in a stable fashion. Also, since a time tAA2 is reduced as an enable time point of the signal Y becomes faster, the data read speed also becomes faster.

Referring to FIG. 7B, since the differential amplifier and latch operates as the latch, even though a cycle of the clock signal CLK becomes shortened, the data can be output stably. That is, even though a next data is input within the enable time t3 of the signal Y, since the previous data is latched and outputted, the data read error does not occur.

Accordingly, in case that the CAS latency is 2, since the differential amplifier and latch operates as the differential amplifier, and the enable time point of the signal Y becomes faster, the data read speed is improved. Also, in the case in which the CAS latency is 3, the differential amplifier and latch operates as the latch, and thus the data read error does not occur.

Figure 8:
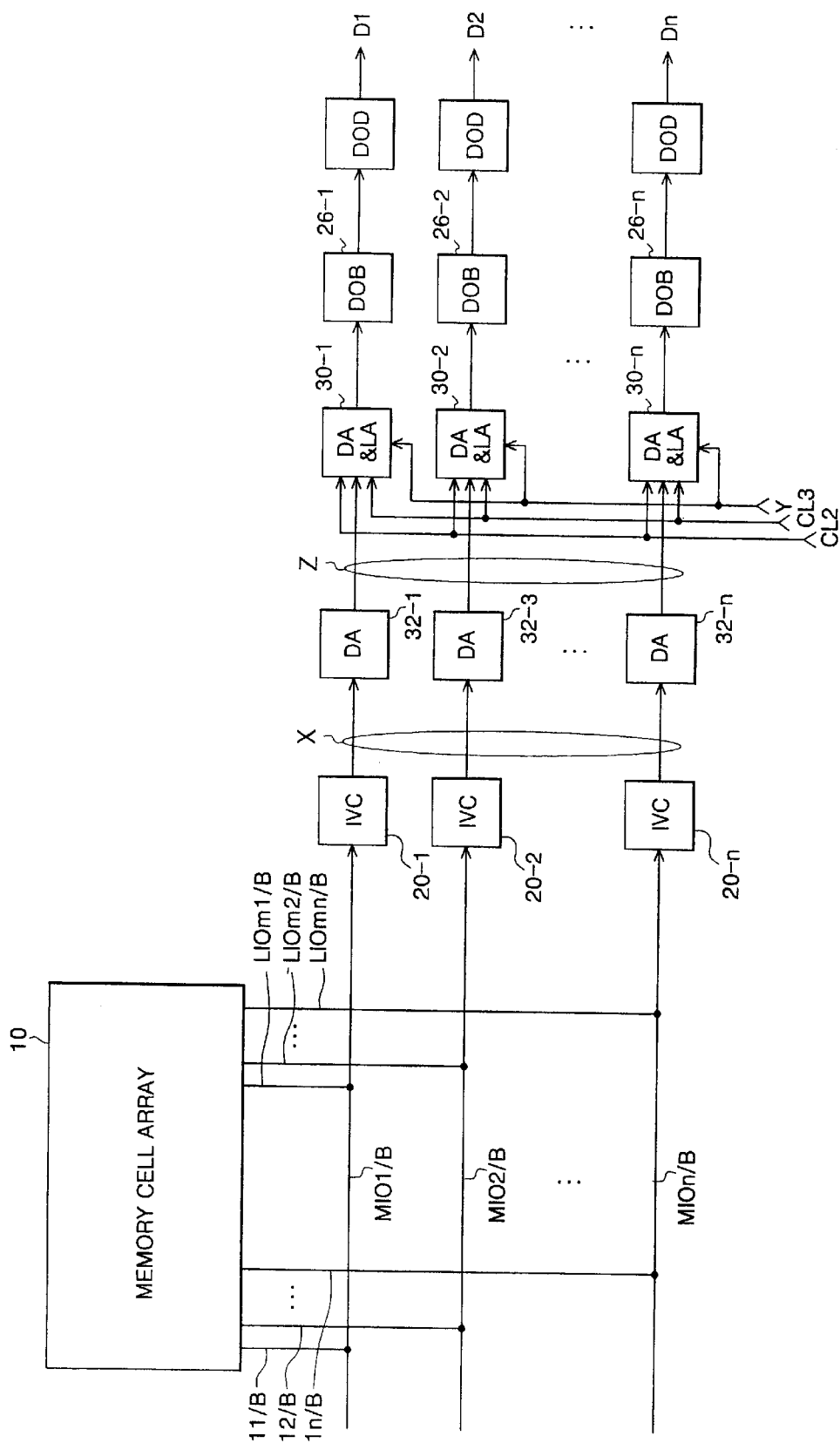
FIG. 8 is a block diagram illustrating a semiconductor memory device according to a second preferred embodiment of the present invention.

FIG. 8 is a block diagram illustrating a semiconductor memory device according to a second preferred embodiment of the present invention. The semiconductor memory device of FIG. 8 additionally includes differential amplifiers 32-1 to 32-n between the current-voltage converters 20-1 and 20-n and the differential amplifier and latches 30-1 to 30-n, in contrast to the configuration of FIG. 5. Like reference numerals of FIGS. 5 and 8 denote like parts.

In the semiconductor memory device of FIG. 8, since a voltage difference of data output from the current-voltage converters 20-1 to 20-n is relatively small, the output data of the current-voltage converters 20-1 to 20-n are amplified by the differential amplifiers 32-1 to 32-n and then are applied to the differential amplifier and latches 30-1 to 30-n, thereby performing a stable data read operation.

Figure 9:
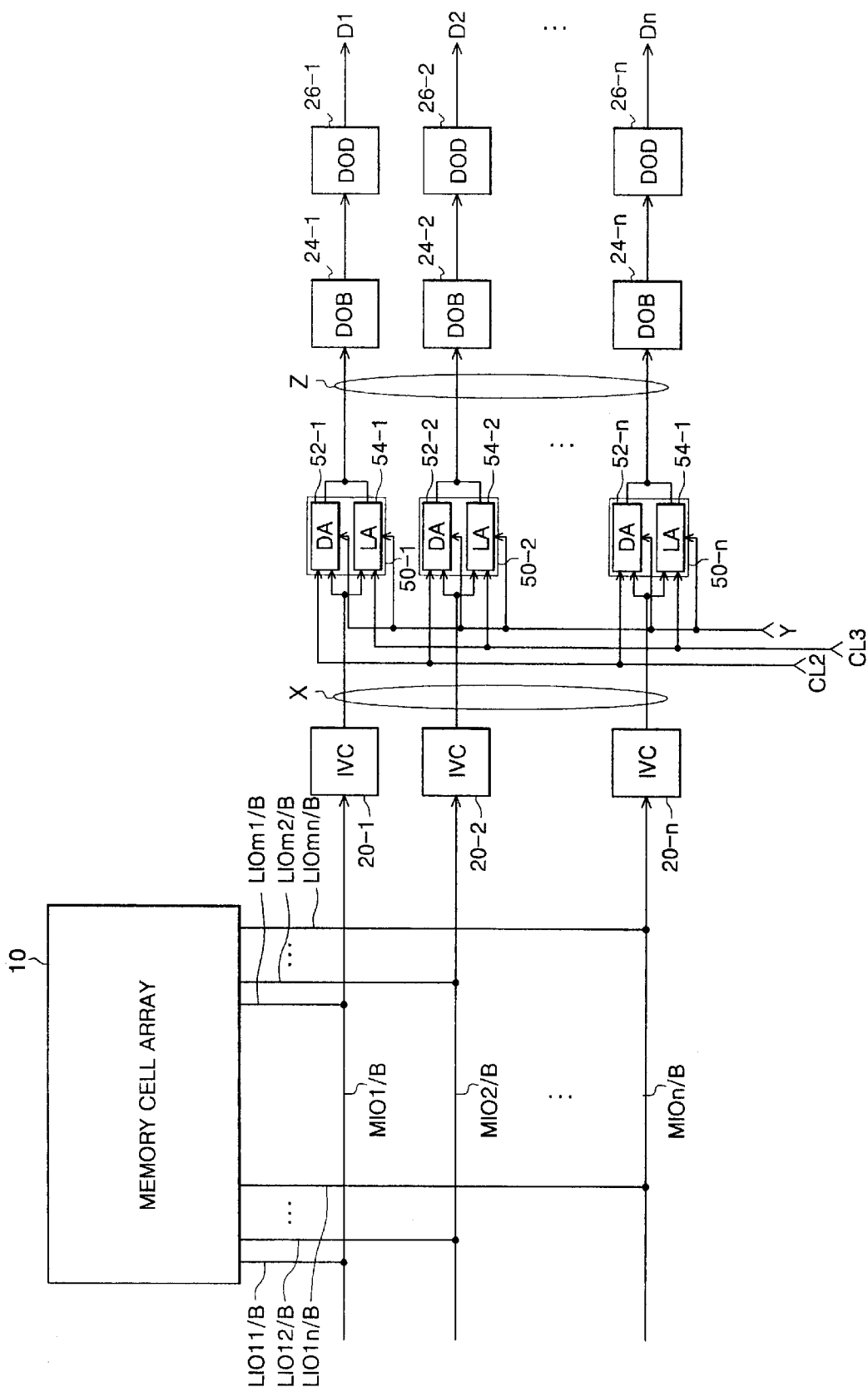
FIG. 9 is a block diagram illustrating a semiconductor memory device according to a third preferred embodiment of the present invention.

FIG. 9 is a block diagram illustrating a semiconductor memory device according to a third preferred embodiment of the present invention. The semiconductor memory device of FIG. 9 includes differential amplifier and latches 50-1 to 50-n arranged between the current-voltage converters 20-1 to 20-n and the data output buffers 24-1 to 24-n, the differential amplifier and latches 50-1 to 50-n including differential amplifiers 52-1 to 52-n and latches 54-1 to 54-n, respectively. Like reference numerals of FIGS. 5 and 9 denote like parts.

In FIG. 9, the differential amplifiers 52-1 to 52-n amplify and output the output data of the current-voltage converters 20-1 to 20-n in response to the signal Y when the CAS latency is 2. The latches 54-1 to 54-n latch and output the output data of the current-voltage converters 20-1 to 20-n at a rising edge of the signal Y when the CAS latency is 3. That is, the differential amplifier and latch of the semiconductor memory device of FIG. 9 includes the differential amplifier and the latch which are formed not integrally but separately. The semiconductor memory device of FIG. 9 does not always require the current-voltage converters 20-1 to 20-n.

Figure 10:
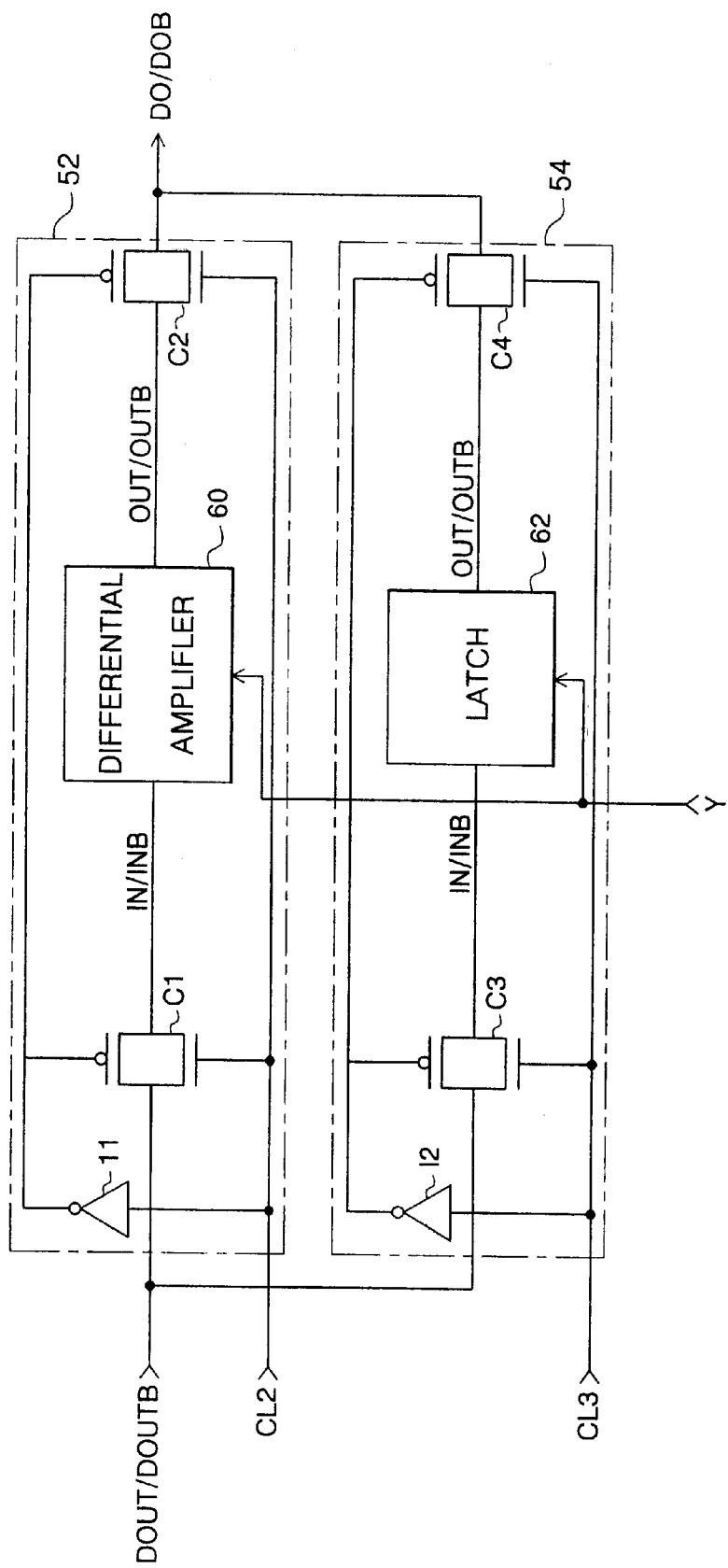
FIG. 10 is a circuit diagram illustrating the differential amplifier and latch of FIG. 9.

FIG. 10 is a circuit diagram illustrating one embodiment of the differential amplifier and latch of FIG. 9. A differential amplifying circuit 52 includes an inverter I1 and CMOS transmission gates C1 and C2 in addition to a differential amplifier 60. A latching circuit 54 includes an inverter I2 and CMOS transmission gates C3 and C4 in addition to a latch 62.

When the CAS latency is set to 2, the signal CL2 has a logic "high" level, and the signal CL3 has a logic "low" level. The CMOS transmission gates C1 and C2 are turned on so that data CSA and CSAB output from the current-voltage converters are transferred. At this moment, when the data output through the CMOS transmission gate C1 is a data IN/INB, the differential amplifier 60 amplifies a voltage difference of the data IN/INB to generate the data OUT/OUTB in response to the signal Y. The CMOS transmission gate C2 transmits the data OUT/OUTB. At this time, the data output through the CMOS transmission gate C2 is a data DO/DOB.

When the CAS latency is set to 3, the signal CL3 has a logic "high" level, and the signal CL2 has a logic "low" level. The CMOS transmission gates C3 and C4 are turned on so that data CSA and CSAB output from the current-voltage converters are transferred. At this moment, when the signal output through the CMOS transmission gate C3 is data IN/INB, the latch 62 latches the data IN/INB to generate the data OUT/OUTB in response to the signal Y. An enable time point of the signal Y generated at this time becomes slower than an enable time point of the signal Y generated when the CAS latency is 2. The CMOS transmission gate C4 transmits the data OUT/OUTB. At this time, the data output through the CMOS transmission gate C4 is data DO/DOB. Even though not shown in FIG. 10, another differential amplifier can additionally be arranged at a front stage of the differential amplifier 60.

Figure 11:
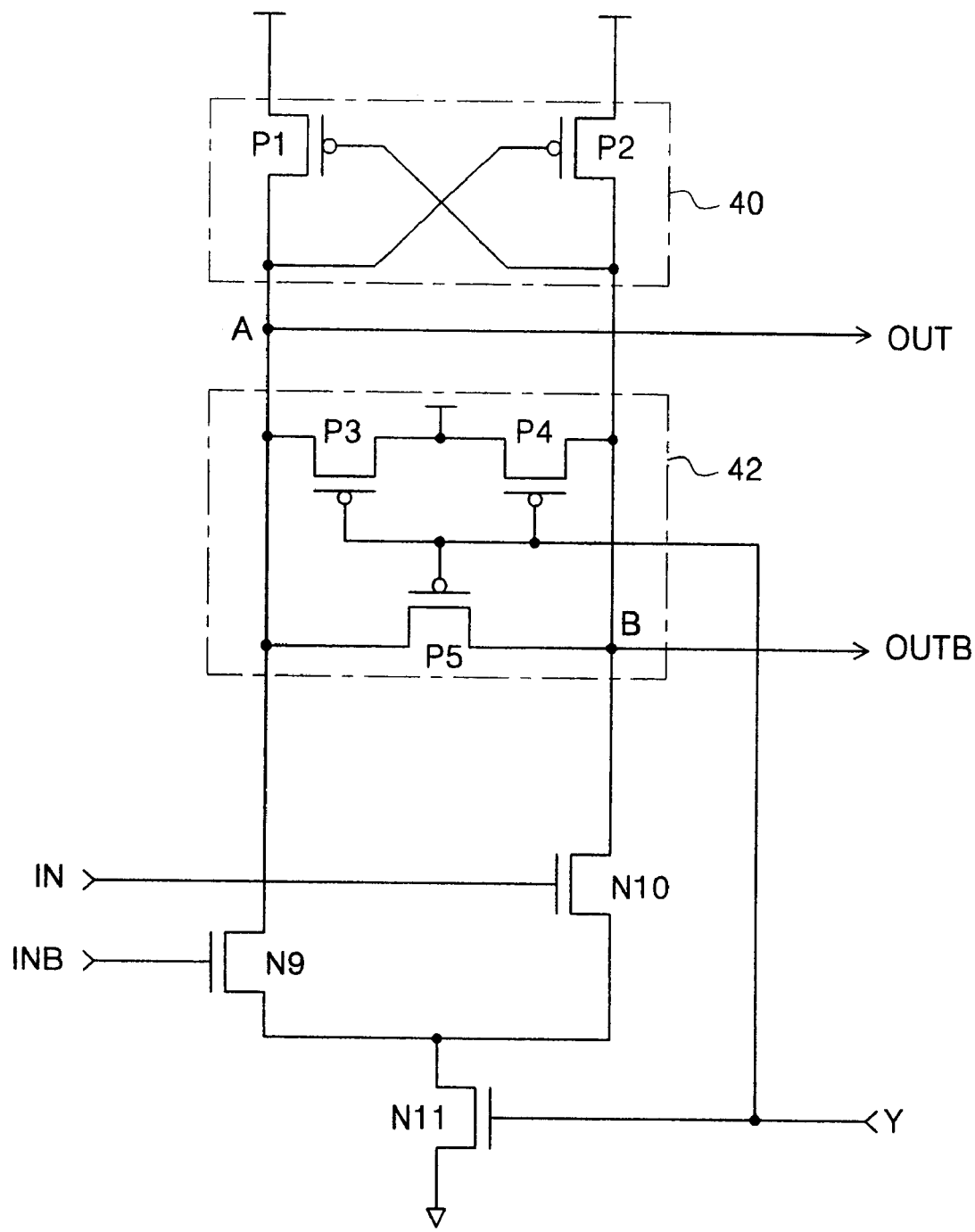
FIG. 11 is a circuit diagram illustrating a differential amplifier of FIG. 10.

FIG. 11 is a circuit diagram illustrating one embodiment of the differential amplifier of FIG. 10. The differential amplifier of FIG. 11 includes the PMOS transistors P1 to P5 and the NMOS transistors N9 to N11 of the differential amplifier and latch of FIG. 6.

Operation of the differential amplifier of FIG. 11 is described below. When the signal Y has a logic "low" level, the PMOS transistors P3 to P5 are turned on, so that the nodes A and B are pre-charged. When the signal Y is transitioned to a logic "high" level, the PMOS transistors P3 to P5 are turned off, and the NMOS transistor N11 is turned on, whereupon an operation of the differential amplifier is enabled. In this state, when the data IN having a logic "high" level and the data INB having a logic "low" level are applied, the NMOS transistor N10 is turned on, and the NMOS transistor N9 is turned off, whereupon the nodes A and B are transitioned to a logic "high" level and a logic "low" level, respectively. The PMOS latch 40 amplifies signals of the nodes A and B. Accordingly, the output data OUT and the inverted output data OUTB are transitioned to a logic "high" level and a logic "low" level. However, when the signal having a logic "low" level and the signal having a logic "high" level are generated during the signal Y having a logic "high" level, the nodes A and B are transitioned to a logic "low" level and a logic "high" level, respectively. That is, when levels of the data IN and INB are varied in state that the signal Y remains low, states of the output data OUT and the inverted output data OUTB are varied.

Figure 12:
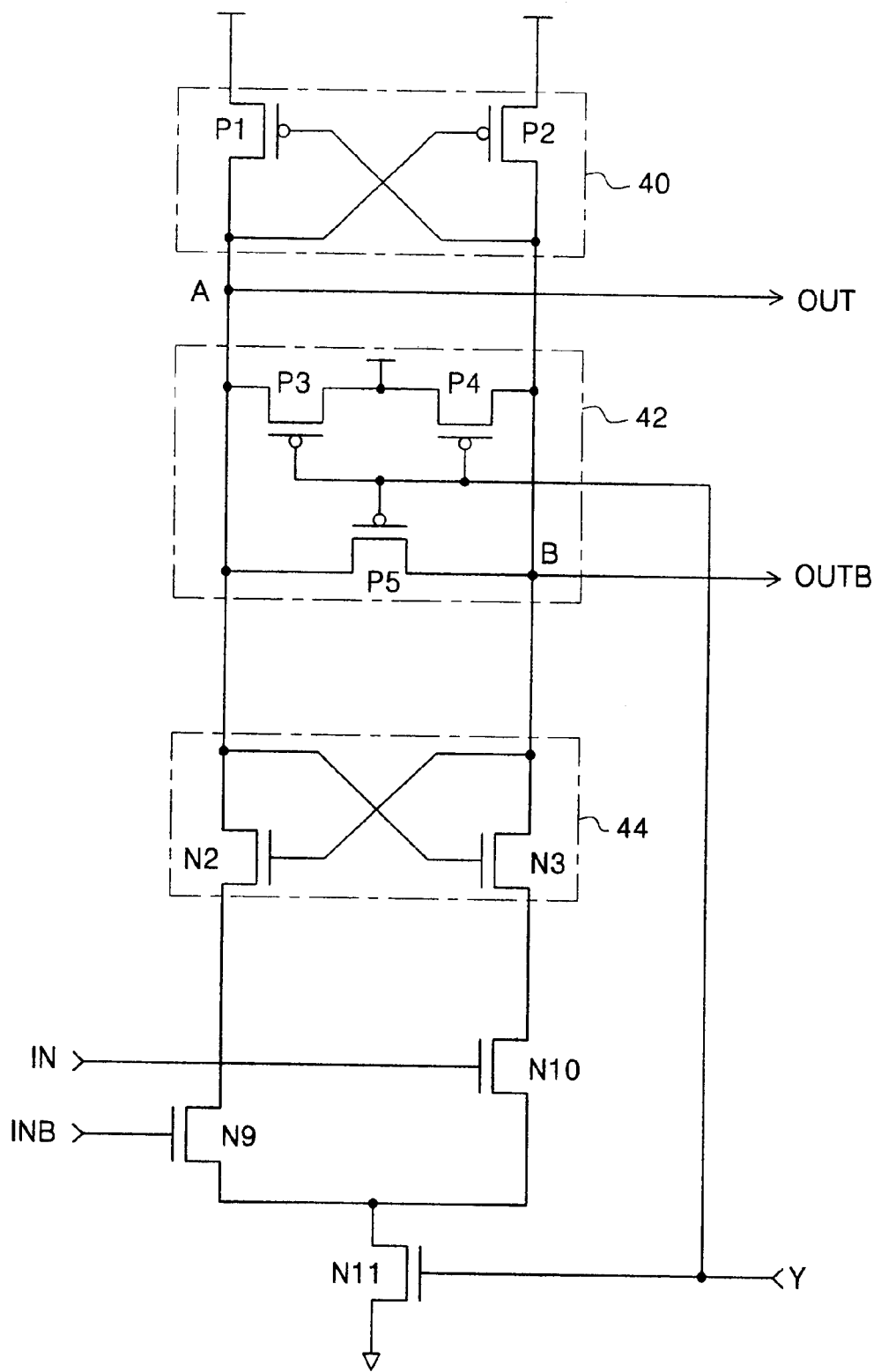
FIG. 12 is a circuit diagram illustrating a latch of FIG. 10.

FIG. 12 is a circuit diagram illustrating one embodiment of the latch of FIG. 10. The latch of FIG. 12 includes the PMOS transistors P1 to P5 and the NMOS transistors N2, N3, and N9 to N11 of the differential amplifier and latch of FIG. 6.

Operation of the latch of FIG. 12 is described below. When the signal Y is transitioned to a logic "high" level, the PMOS transistors P3 to P5 are turned off, and the NMOS transistor N11 is turned on, whereupon an operation of the latch is enabled. In this state, when the data IN having a logic "high" level and the data INB having a logic "low" level are applied, the NMOS transistor N10 is turned on, and the NMOS transistor N9 is turned off, whereupon the nodes A and B are transitioned to a logic "high" level and a logic "low" level, respectively. The PMOS latch 40 and the NMOS latch 44 latch the nodes B and A, respectively. Accordingly, the output data OUT and the inverted output data OUTB are transitioned to a logic "high" level and a logic "low" level. However, even though the data having a logic "low" level and the data having a logic "high" level are generated while the signal Y is at a logic "high" level, the data cannot be transferred to the nodes A and B through the NMOS latch 44, and thus the nodes A and B maintain a latched level. That is, levels of the output data OUT and the inverted output data OUTB are not varied and maintain a first-latched level.

An enable time point when the differential amplifier and latch is operated as the differential amplifier of FIG. 11 becomes faster that that when operated as the latch of FIG. 12.

The differential amplifier of FIG. 11 and the latch of FIG. 12 are configured using the differential amplifier and latch of FIG. 6 but can be configured using the conventional differential amplifier and the conventional latch, respectively.

As described herein, the semiconductor memory device outputs the output signal of the current-voltage converter through the latch in the case in which the CAS latency operation is relatively high in need for a frequency characteristic. Also, in case in which the CAS latency operation is relatively low in need for a frequency characteristic, the semiconductor memory device makes the enable time point of the signal Y faster than in case in which the CAS latency operation is relatively high in need for a frequency characteristic and outputs the output data of the current-voltage voltage converter through the differential amplifier. As a result, the data read error can be reduced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device, comprising:
    a memory cell array; and
    a differential amplifying and latching circuit for latching and outputting each of signal pairs output from the memory cell array in the case of a first latency operation, and for amplifying a voltage difference of each of the signal pairs output from the memory cell array in the case of a second latency operation.

2. The device of claim 1, further comprising a current-voltage converting circuit for converting a current difference of each of the signal pairs output from the memory cell array into a voltage difference and outputting the voltage difference to the differential amplifying and latching circuit.

3. The device of claim 1, further comprising a differential amplifying circuit between the memory cell array and the differential amplifying and latching circuit.

4. The device of claim 1, wherein the differential amplifying and latching circuit includes:
    a first NMOS transistor connected between a first node and a first power voltage and being turned on in response to an enable signal;
    a second NMOS transistor connected between a second node and the first node and being turned on in response to an inverted output signal output from the memory cell array;
    a third NMOS transistor connected between a third node and the first node and being turned on in response to an output signal output from the memory cell array;
    a first pre-charge circuit connected between the second node and the third node and being turned on in response to an inverted enable signal;
    a first latch for latching a voltage of the second node and the third node in case of the first latency operation;
    a second pre-charge circuit for pre-charging a voltage of fourth and fifth nodes in response to the inverted enable signal;
    a first switching circuit being turned on in case of the first latency operation to transmit a voltage of the second node and the third node to the fourth node and the fifth node;
    a second latch connected to a second power voltage for latching a voltage of the fourth node and the fifth node;
    a disable circuit for disabling an operation of the first latch in case of the second latency operation; and
    a second switching circuit being turned on in case of the second latency operation to transmit a voltage of the second node and the third node to the fourth node and the fifth node.

5. The device of claim 4, wherein an enable time point of the enable signal of the second latency operation is fater than that of the first latency operation.

6. A semiconductor memory device, comprising:
    a memory cell array;
    a latch circuit for latching and outputting each of signal pairs output from the memory cell array in case of a first latency operation; and
    a differential amplifying circuit for amplifying and outputting each of the signal pairs output from the memory cell array in case of a second latency operation.

7. The device of claim 6, further comprising a current-voltage converting circuit for converting a current difference of each of the signal pairs output from the memory cell array into a voltage difference and outputting the voltage difference to the latching circuit and the differential amplifying circuit.

8. The device of claim 6, further comprising a differential amplifying circuit between the memory cell array and the differential amplifying circuit.

9. The device of claim 6, wherein the latch circuit includes:
    a first swtch for being turned on in case of the first latency operation to transmit an output signal of the current-voltage converting circuit;
    a latch circuit for latching and outputting a signal output through the first switch; and
    a second switch for transmitting an output signal of the latch circuit in case of the first latency operation.

10. The device of claim 9, wherein the latch circuit includes:
    a first NMOS transistor connected between a first node and a first power voltage and being turned on in response to an enable signal;
    a second NMOS transitor connected between a second node and the first node and being turned on in response to an inverted output signal output through the first switch;
    a third NMOS transistor connected between a third node and the first node and being turned on in response to an output signal output through the second switch;
    a first latch for laticing and outputting a signal of the second node and the third node to fourth and fifth nodes;
    a first pre-charge circuit for pre-charging the fourth node and the fifth node in response to an inverted enable signal; and a second latch connected to a second power voltage for latching a signal of the fourth node and the fifth node.

11. The device of claim 10, wherein an enable time point of the enable signal of the second latency operation is faster than that of the first latency operation.

12. The device of claim 6, wherein the differential amplifying circuit includes:

a third switch for being turned on in case of the second latency operation to transmit an output signal of the current-voltage converting circuit;

a differential amplifer for amplifying a signal output through the third switch; and a fourth switch for transmitting an output signal of the differential amplifier in case of the second latency operation.

13. The device of claim 12, wherein the differential amplifier includes:

a fourth NMOS transistor connected between a sixth node and a first power voltage and being turned on in response to the enable signal;

a fifth NMOS transistor connected between a seventh node and the sixth node and being turned on in response to an inverted output signal output through the third switch;

a sixth NMOS transitor connected between an eighth node and the sixth node and being turned on in response to an output signal output through the third switch;

a second pre-charge circuit for pre-charging the seventh node and the eighth node in response to the inverted enable signal; and a third latch connected to a second power voltage for latching a signal of the seventh node and the eighth node.

14. A semiconductor memory device, comprising:

a memory cell array;

a first amplifying circuit for amplifying and outputting signals output from the memory cell array in case of a first latency operation; and a second amplifying circuit for amplifying and outputting the signals output from the memory cell array in case of a second latency operation.

15. The device of claim 14, wherein the first amplifying circuit includes a latch.

16. The device of claim 14, wherein the second amplifying circuit includes a differential amplifier.

17. A method of reading a data in a semiconductor memory device, comprising:

outputting data from a memory cell array; and latching and outputting data output from the memory cell array in case of a first latency operation, and amplifying and outputting the data output from the memory cell array in case of a second latency operation.

18. The method of claim 17, wherein a time point to latch and output the data output from the memory cell array in case of the second latency operation is faster than a time point to amplify and output the data output from the memory cell array in case of the first latency operation.

19. A semiconductor memory device, comprising:

a memory cell array; and a first amplifier for amplifying signal pairs output from the memory cell array in case of a first CAS latency operation, and a second amplifier for amplifying the signal pairs output from the memory cell array in case of a second CAS latency operation.

20. The device of claim 19, wherein the first amplifier is a differential amplifier and the second amplifier is a latch amplifier.

\* \* \* \* \*

UNITED STATES PATENT AND TRADEMARK OFFICE
CERTIFICATE OF CORRECTION

PATENT NO.   : 6,529,432 B2
DATED        : March 4, 2003
INVENTOR(S)  : Byung-Chul Kim and Won-Il Bae It is certified that error appears in the above-identified patent and that said Letters Patent is hereby corrected as shown below:

<u>Column 10,</u>
Line 40, delete "swtch" and insert -- switch --.
Line 54, delete "transitor" and insert -- transistor --.
Line 61, delete "latcing" and insert -- latching --.

Signed and Sealed this

Eighth Day of July, 2003

JAMES E. ROGAN
*Director of the United States Patent and Trademark Office*